United States Patent [19]
Fink

[11] Patent Number: 5,841,691
[45] Date of Patent: Nov. 24, 1998

[54] ADJUSTABLE CELL PLATE GENERATOR

[75] Inventor: William M. Fink, Princeton Junction, N.J.

[73] Assignee: Micron Technology, Inc., Boise, Id.

[21] Appl. No.: 979,403

[22] Filed: Nov. 26, 1997

Related U.S. Application Data

[63] Continuation of Ser. No. 800,715, Feb. 17, 1997, Pat. No. 5,771,188, Continuation of Ser. No. 568,833, Dec. 7, 1995, Pat. No. 5,640,340, which is a continuation of Ser. No. 374,840, Jan. 18, 1995, Pat. No. 5,500,824.

[51] Int. Cl.$^6$ ........................................................ G11C 7/00
[52] U.S. Cl. ...................... 365/149; 365/189.09; 365/201
[58] Field of Search ................................... 365/149, 201, 365/189.09, 226

[56] References Cited

U.S. PATENT DOCUMENTS

| | | | |
|---|---|---|---|
| 4,839,865 | 6/1989 | Sato et al. ................................ | 365/201 |
| 5,118,968 | 6/1992 | Douglas et al. ......................... | 307/362 |
| 5,297,087 | 3/1994 | Porter ...................................... | 365/201 |
| 5,317,532 | 5/1994 | Ochii ....................................... | 365/149 |
| 5,459,684 | 10/1995 | Nakamura et al. ..................... | 365/149 |
| 5,500,824 | 3/1996 | Fink ........................................ | 365/201 |
| 5,508,962 | 4/1996 | McLaughlin et al. ............. | 365/189.09 |
| 5,640,340 | 6/1997 | Fink ........................................ | 365/149 |

*Primary Examiner*—Son Mai
*Attorney, Agent, or Firm*—Wells, St. John, Roberts, Gregory & Matkin, P.S.

[57] ABSTRACT

A dynamic random access memory device includes a plurality of dynamic memory cells. Each dynamic memory cell is formed at least in part by a cell plate which is connected to a normally fixed reference voltage. The reference voltage is produced by a cell plate generator. The cell plate generator has a first group of voltage divider transistors connected in series from an upper supply voltage source, and a second group of voltage divider transistors connected in series from a lower supply voltage source. The first and second groups of series-connected voltage divider elements form two intermediate voltage divider nodes which are connected to establish the reference voltage. The voltage divider elements are selected to normally establish the reference voltage at a nominal operating value. However, a first bypass transistor is connected around at least one of the voltage divider elements of the first group to selectively bypass it and to thereby raise the reference voltage to a first adjusted testing value which is greater than the nominal operating value. A second bypass transistor is connected around at least one of the voltage divider elements of the second group to selectively bypass it and to thereby lower the reference voltage to a second adjusted testing value which is lower than the nominal operating value.

15 Claims, 4 Drawing Sheets

ADJUSTABLE CELL PLATE GENERATOR

CROSS REFERENCE TO RELATED APPLICATION

This is a continuation of U.S. patent application Ser. No. 08/800,715, filed Feb. 17, 1997, U.S. Pat. No. 5,771,188, and titled "Adjustable Cell Plate Generator" which in turn is a continuation of U.S. patent application Ser. No. 08/568,833, filed Dec. 7, 1995, now U.S. Pat. No. 5,640,340 which in turn is a continuation of U.S. patent application Ser. No. 08/374,840, filed Jan. 18, 1995, now U.S. Pat. No. 5,500,824.

TECHNICAL FIELD

This invention relates to cell plate generators used in dynamic random access memory integrated circuits.

BACKGROUND OF THE INVENTION

Figure 1:
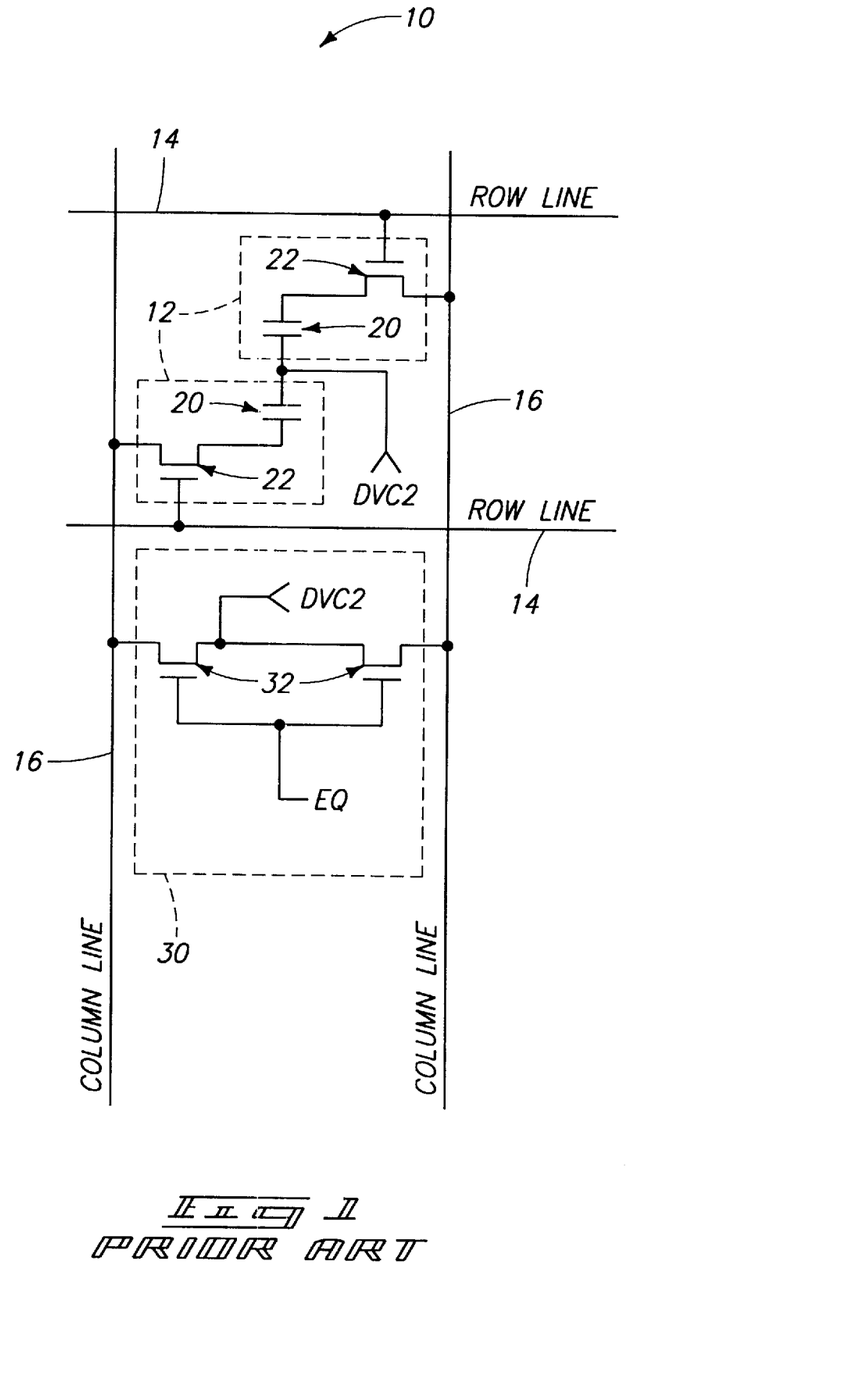
FIG. 1 is a schematic diagram of a portion of a prior art dynamic random access memory device.

FIG. 1 shows a portion of a dynamic random access memory (DRAM) device 10. DRAM 10 includes a plurality of dynamic memory cells or units 12, a plurality of row or word lines 14, and a plurality of column or bit lines 16. Only two memory cells 12, two row lines 14, and two column lines 16 are shown in FIG. 1.

The dynamic memory cells of DRAM 10 are arranged in memory array columns which each include numerous memory cell pairs such as the single pair shown. Each column might contain, for example, 1024 or 2048 pairs of memory cells. Each memory cell 12 comprises a storage capacitor or cell 20 and an access switch or device 22 which is preferably an n-channel metal oxide semiconductor field effect transistor (n-MOSFET).

Dynamic memory cell 20 is operated by and with reference to upper and lower supply voltages. The lower supply voltage is typically referred to as ground, while the upper voltage is referred to as $V_{cc}$. A first side or cell plate of storage cell 20 is connected to an intermediate reference voltage between $V_{cc}$ and ground. This reference voltage is typically equal to $V_{cc}/2$, or the average of the upper and lower memory cell supply voltages. It is produced by a cell plate generator circuit, and is referred to as DVC2. The first cell plates of all storage cells 20 are typically formed by a single conducting layer within memory device 10, and therefore all are connected to DVC2 at a common electrical potential.

A second side or plate of storage cell 20 is connected to one active terminal of access device 22. One of column lines 16 is connected to the other active terminal of access device 22. The gate or control terminal of access device 22 is connected to one of row lines 14. Each memory unit 12 is therefore connected to both a row line 14 and a column line 16.

The row lines and column lines form a two-dimensional matrix having a plurality of intersections. A single memory cell 12 corresponds to each intersection between a row line and a column line. At a single such intersection, a row line is connected to selectively activate the corresponding memory unit. Activating the memory unit connects the memory units storage capacitor to the corresponding column line to allow conventional memory access operations such as reading, writing, or refreshing.

Memory device 10 utilizes what is commonly referred to as a "folded" column line configuration, wherein each pair of column lines is associated with only a single positive sense amplifier (not shown), a single negative sense amplifier (not shown) and a single column line equilibrate circuit 30. Each equilibrate circuit 30 includes a pair of equilibrate transistors 32. One active terminal of each equilibrate transistor is connected to receive the cell plate reference voltage DVC2. The other active terminal of each equilibrate transistor 32 is connected to one of the adjacent column lines 16. Equilibrate circuits 30 are responsive to an equilibrate signal EQ to simultaneously connect s reference voltage DVC2 to the column lines. During normal memory access operations, equilibrate signal EQ is activated to "pre-charge" the column lines to intermediate reference voltage DVC2 prior to activating transfer devices 22 and accessing memory cells.

The memory functions of memory device 10 are performed by storage cells 20. The first cell plate of each storage cell is maintained at a non-varying intermediate voltage—reference voltage DVC2. The second cell plate is charged to either the upper supply voltage ($V_{cc}$) or the lower supply voltage (ground), depending on whether a binary 1 or 0 is being written to the cell. Reading a memory cell is performed by detecting whether the memory cell's second plate is above or below the intermediate reference voltage.

Figure 2:
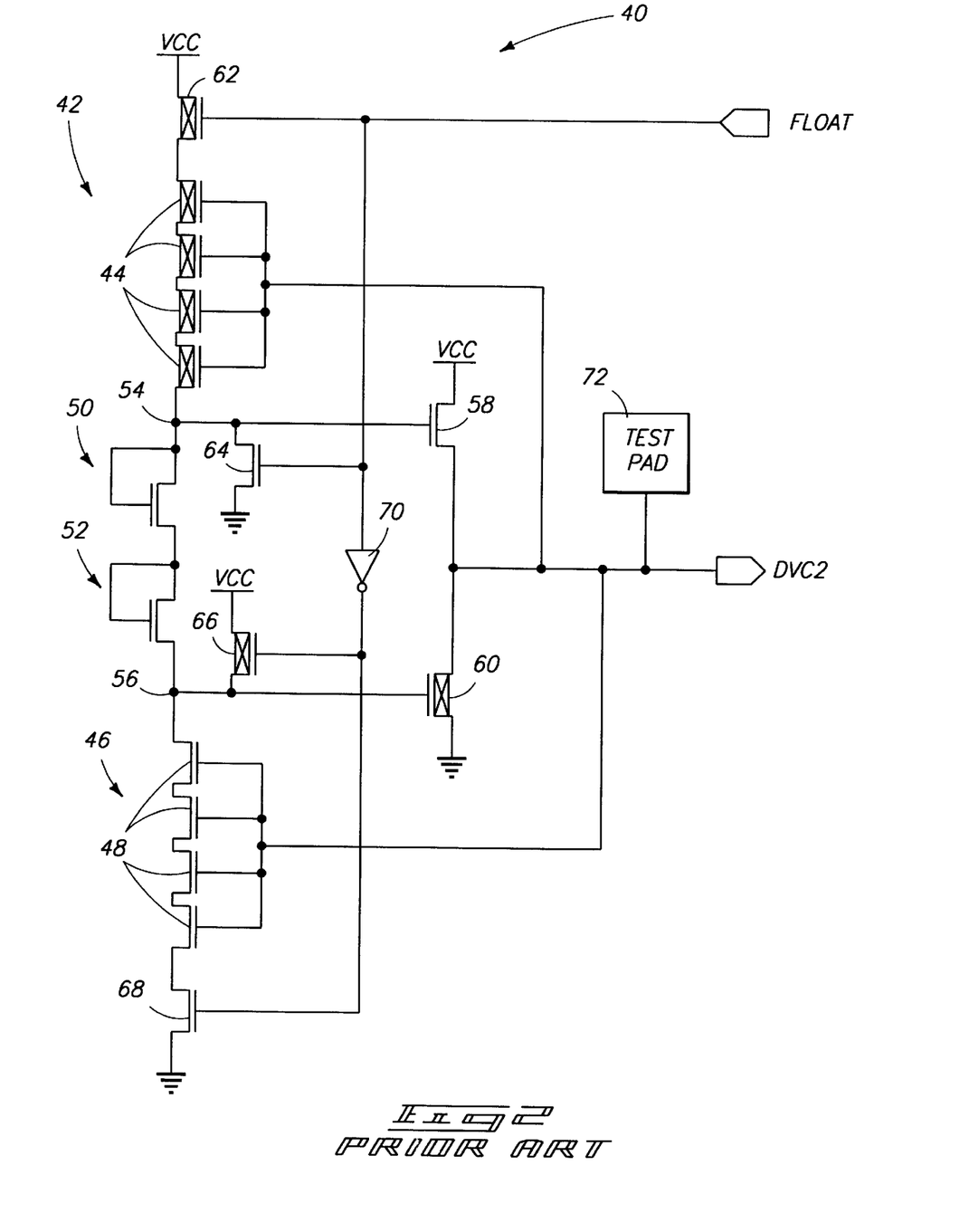
FIG. 2 is a schematic diagram of a prior art cell plate generator.

FIG. 2 shows a typical cell plate generator circuit 40 for producing reference voltage DVC2. In normal operation, cell plate generator 40 produces reference voltage DVC2 at a nominal intermediate operating value approximately midway between $V_{cc}$ and ground. Cell plate generator 40 includes a first or upper group 42 of voltage dividing p-MOSFET (p-channel metal oxide semiconductor field effect transistor) transistors 44. Cell plate generator 40 also includes a second or lower group 46 of voltage dividing n-MOSFET (n-channel MOSFET) transistors 48. Transistors 44 and 48 are relatively small so that they have appreciable resistance at relevant operating currents. The transistors of each group are connected in series with each other, and the two transistor groups are connected in series between the upper memory cell supply voltage ($V_{cc}$) and the lower memory cell supply voltage (ground). The transistors thus form a voltage divider between $V_{cc}$ and ground.

A pair of diode-connected n-MOSFET transistors 50 and 52 are connected in series between the two groups of voltage dividing transistors. This forms first and second intermediate voltage divider nodes 54 and 56 in cell plate generator 40. First intermediate node 54 is maintained at a somewhat higher voltage than second intermediate node 56 by the diode-connected transistors. Diodes 50 and 52 ensure that first intermediate voltage divider node 54 is always at a somewhat higher voltage than second intermediate voltage divider node 56.

Cell plate generator 40 includes an output stage comprising a complementary pair of output transistors 58 and 60. n-MOSFET driver transistor 58 has its gate connected to first intermediate node 54, and p-MOSFET driver transistor 60 has its gate connected to second intermediate node 56. The drain of n-MOSFET driver transistor 58 is connected to $V_{cc}$. The drain of p-MOSFET driver transistor 60 is connected to ground. The sources of the two transistors are connected together to supply reference voltage DVC2. Thus, the voltage divider formed by the first and second group of voltage dividing transistors determines and establishes the value of DVC2. Transistors 44 and 48 must be carefully designed and manufactured to establish the correct value for DVC2. In some designs, individual voltage dividing transistors can be removed or disabled during product development to "tune in" the cell plate generator so that it produces an optimum value for DVC2.

Cell plate generator 40 includes feedback to regulate DVC2 in response to changing current requirements. This feedback is implemented by connecting the gates of voltage-dividing transistors 44 and 48 to DVC2. With this connection, a decrease in the voltage of DVC2 decreases the effective resistance of first voltage-dividing transistors 44 while increasing the effective resistance of second voltage-dividing transistors 48. This in turn increases the current supplying ability of the generator and raises the value of DVC2. An increase in the voltage of DVC2 increases the effective resistance of first voltage-dividing transistors 44 while decreasing the effective resistance of second voltage-dividing transistors 48. This in turn decreases the current supplying ability of the generator and lowers DVC2. This regulates DVC2 to correct for changing current demands placed on the cell plate generator.

The value and stability of DVC2 is very important to correct DRAM operation, since all memory read/write operations use DVC2 as a reference. Nevertheless, small variations in DVC2 are expected, and memory cells must allow for such variations. In fact, adequate tolerance for DVC2 variations is very important for correct and reliable DRAM operation. Accordingly, DRAM testing procedures frequently and desirably include extensive verification and determination of DVC2 margins allowed by each chip and the various components of each chip without resulting in memory errors.

For this reason, cell plate generator 40 includes provisions for changing reference voltage DVC2 during probe testing. Specifically, cell plate generator 40 is responsive to a test mode signal FLOAT to float or present a high impedance at the output node which is formed between driver transistors 58 and 60. The FLOAT signal is connected to the gate of a first cut-off p-MOSFET transistor 62. Transistor 62 is connected in series between $V_{cc}$ and the first group 42 of voltage dividing transistors to disconnect the voltage divider circuit from $V_{cc}$ in response to the FLOAT signal. The FLOAT signal is also connected to the gate of an n-MOSFET grounding transistor 64. Grounding transistor 64 is connected from first intermediate node 54 to ground so that it turns off n-MOSFET driver transistor 58 in response to the FLOAT signal. Similar transistors 66 and 68 are used to turn off p-MOSFET driver transistor 60 and to disconnect the voltage divider circuit from ground in response to the FLOAT signal. An inverter circuit 70 provides an inverted form of the FLOAT signal to the gates of these transistors. The FLOAT signal therefore "turns off" the cell plate generator and allows DVC2 to "float."

Cell plate generator 40 also includes a test pad or probe access point 72 which is accessible during probe testing to directly control the value of reference voltage DVC2 with external testing equipment. DVC2 is varied by such equipment over a specified range of test voltages to test individual dies, before packaging, for acceptable reference voltage margins. An acceptable DRAM chip should operate correctly over a range of reference voltage values.

Testing by manipulating DVC2 has been performed during wafer-level probe testing. It has also been performed after chip packaging. Such margin testing is typically performed for diagnostic purposes on chips which have failed the extensive tests which follow packaging. In order to perform such testing, the package must be destructively removed or etched away from over the internal die to allow access to probe access points such as probe access point 72 of cell plate generator 40.

While post-packaging diagnostic testing has been used at times in the past, newer methods of chip packaging have made the practice much more difficult—if not impossible. Leads over chip (LOC) packaging technology, specifically, has complicated the task of exposing die test pads and probe access points once the die has been packaged.

Figure 3:
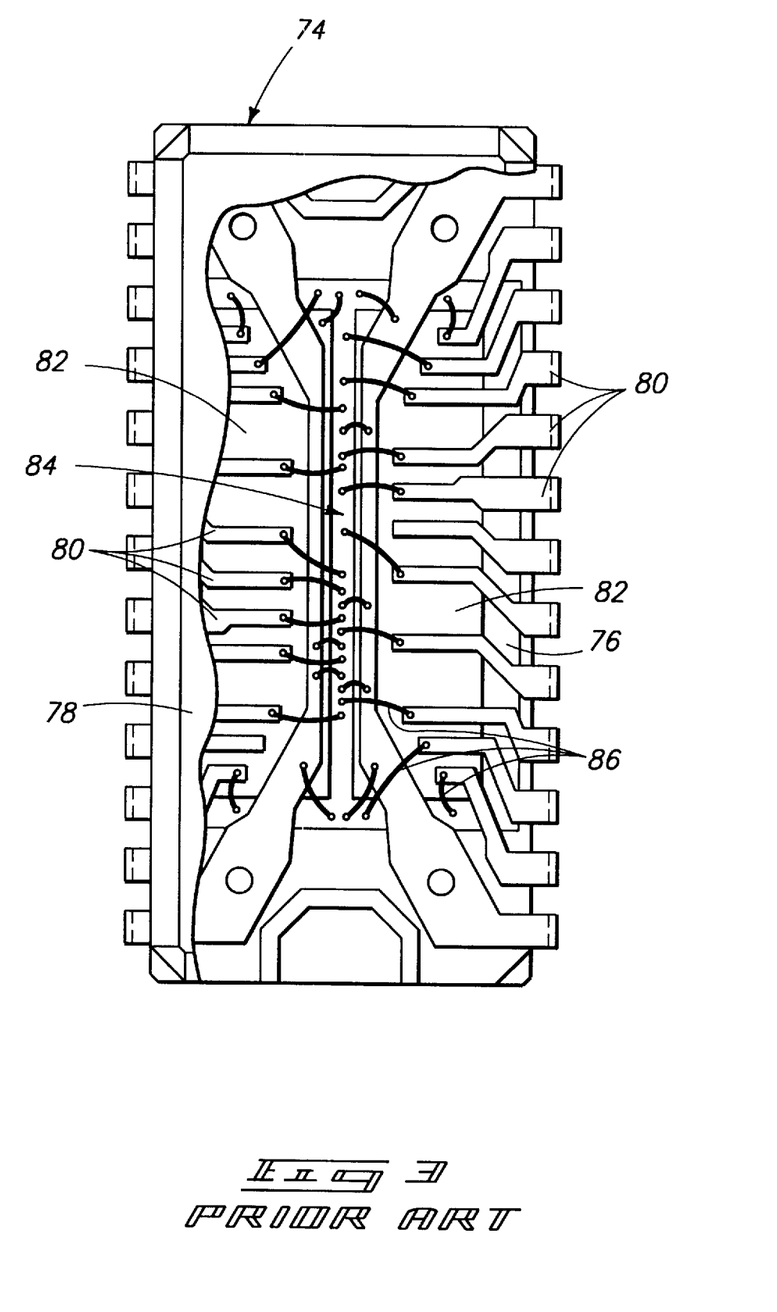
FIG. 3 is a simplified top view of a DRAM integrated circuit which has been packaged with leads-over-chip technology. A top portion of the integrated circuit has been broken away to show internal components.

FIG. 3 shows a packaged integrated circuit (IC) 74 utilizing LOC technology. IC 74 contains a DRAM die 76, encased in a plastic package 78. The top of package 78 is partially broken away in FIG. 3 to show internal components such as die 76. LOC-packaged IC 74 differs from more conventional ICs in that its lead frame is physically laminated to the face of die 76. Specifically, leads 80 are laminated to the face of die 76 with strips of double-sided adhesive film 82. Inner ends of leads 80 extend over the die face, to nearly the center of die 76. A narrow path 84 of die 76, generally along its longitudinal centerline, is left exposed for placement of bonding pads. Conventional wire-bond connections 86 extend between leads 80 and bonding pads within narrow path 84.

While this type of IC packaging provides a number of readily apparent advantages, it practically rules out the possibility of post-packaging diagnostic testing using test probes. The central wire bonds and chip leads overlying the die face leave no room for probe access. Furthermore, the leads and various bonds and bonding materials cannot be conveniently removed to allow probe access. Thus, a valuable diagnostic tool is lost when leads over chip packaging is utilized.

However, the invention described below allows post-packaging DVC2 margin testing even when LOC packaging technology is used. Additionally, it allows DVC2 margin testing to be performed on every packaged DRAM chip, as a routine part of packaged part production testing. Routine margin testing of all packaged chips had previously been impractical, since it required destructively removing portions of chip packaging. The invention, however, allows DVC2 margin testing of packaged parts. It thus allows a much wider range of post-packaging acceptance and diagnostic testing than has previously been possible.

DETAILED DESCRIPTION OF THE PREFERRED EMBODIMENT

This disclosure of the invention is submitted in furtherance of the constitutional purposes of the U.S. Patent Laws "to promote the progress of science and useful arts." U.S. Constitution, Article 1, Section 8.

Figure 4:
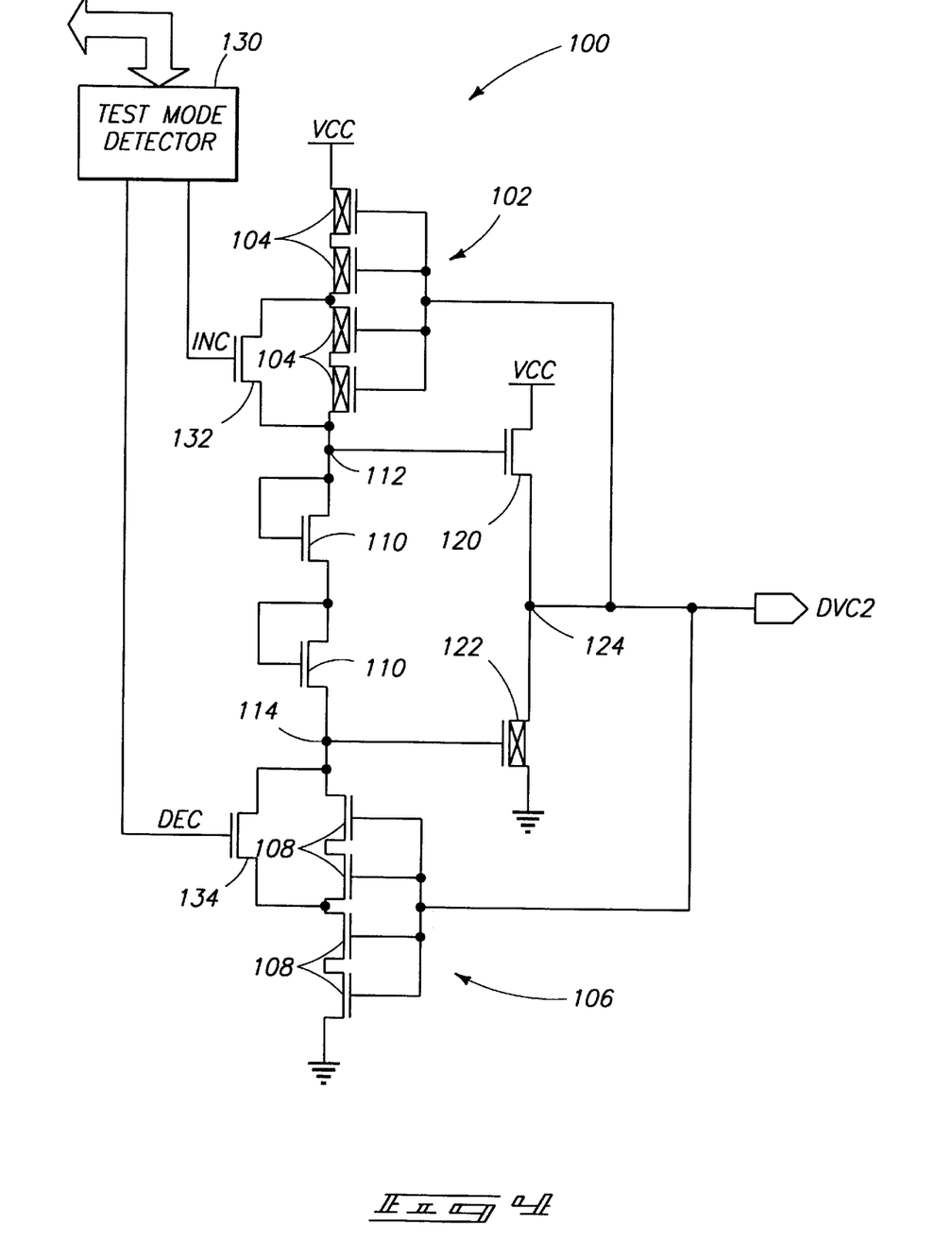
FIG. 4 is a schematic diagram of a cell plate generator for use in a DRAM device in accordance with the invention.

FIG. 4 shows a cell plate generator 100 in accordance with a preferred embodiment of the invention. Cell plate generator 100 is incorporated within a dynamic random access memory device containing a plurality of dynamic memory cells such as already described with reference to FIG. 1. As described, each such dynamic memory cell is formed at least in part by a common cell plate which is connected to an intermediate-value cell plate reference voltage DVC2. Cell plate generator 100 is powered by upper and lower supply voltages or voltage sources, $V_{cc}$ and ground, which are typically the same supply voltages used by the DRAM memory circuits in general and by the dynamic memory cells themselves.

Cell plate generator 100 normally produces reference voltage DVC2 at a nominal intermediate operating value between the upper and lower supply voltages, as already described above. However, it includes voltage adjustment circuits which are responsive to test mode signals to selectively adjust reference voltage DVC2, during DRAM testing, to adjusted values within the limits of $V_{cc}$ and ground.

Cell plate generator 100 includes a first group 102 of variable upper voltage divider elements 104. Voltage divider elements 104 preferably comprise four or more p-channel metal oxide semiconductor field effect transistors (MOSFETs). Each such voltage dividing transistor 104 has two active terminals, referred to as a drain and a source; and a control terminal, referred to as a gate. Transistors 104 are arranged with their active terminals connected in series from upper supply voltage source $V_{cc}$.

Cell plate generator 100 also includes a second group 106 of variable lower voltage divider elements 108. Voltage divider elements 108 preferably comprise four or more n-channel MOSFETs. Each such transistor 108 has two active terminals referred to as a drain and a source; and a control terminal, referred to as a gate. Transistors 108 are arranged with their active terminals connected in series from ground, alternatively referred to herein as the lower supply voltage source.

First and second voltage divider element groups 102 and 106 are electrically interconnected to form at least one intermediate voltage divider node therebetween. In the preferred embodiment shown in 4 FIG. 4, at least one fixed voltage dropping element 110 is connected in series between the first and second voltage divider element groups 102 and 106 to form first and second intermediate voltage divider nodes, referenced in FIG. 4 by the numerals 112 and 114. Each of voltage dropping elements 110 is an n-channel MOSFET with its gate connected to its drain so that it drops a constant voltage similarly to a forward-biased diode. Elements 110 maintain first intermediate voltage divider node 112 at a fixed voltage above second intermediate voltage divider node 114.

Intermediate voltage divider nodes 112 and 114 are connected to establish or determine the value of reference voltage DVC2. Specifically, these nodes are connected to the inputs of an output stage to directly control the value of DVC2. The output stage comprises a complementary pair of driver transistors 120 and 122. Upper driver transistor 120 is an n-channel MOSFET device which has its drain connected to $V_{cc}$. Lower driver transistor 122 is a p-channel MOSFET device which has its drain connected to ground. The sources of driver transistors 120 and 122 are connected together to form an output node 124. Output node 124 forms intermediate reference voltage DVC2. The gate or control terminal of upper driver transistor 120 is connected to first intermediate voltage divider node 112. The gate or control terminal of lower driver transistor 122 is connected to second intermediate voltage divider node 114. Output stage driver transistors 120 and 122 are therefore responsive to first and second intermediate voltage divider nodes 112 and 114, respectively, to supply reference voltage DVC2 to the common cell plate of the DRAM's memory cells.

Voltage divider elements 104 and 108 are selected to normally produce spaced voltages at intermediate voltage divider nodes 112 and 114 which will result in the desired or nominal intermediate operating value of reference voltage DVC2 at output node 124. This sometimes requires permanent removal or bypassing of individual voltage divider elements during chip development. Cell plate generator 100 furthermore incorporates two feedback loops which regulate DVC2 in spite of varying current loads imposed on output node 124. Specifically, the control inputs or gates of transistors 104 and 108 are electrically connected to reference voltage DVC2. With this connection, a decrease in the voltage of DVC2 decreases the effective resistance of upper voltage-dividing transistors 104 while increasing the effective resistance of lower voltage-dividing transistors 108. An increase in the voltage of DVC2 increases the effective resistance of upper voltage-dividing transistors 104 while decreasing the effective resistance of lower voltage-dividing transistors 108. This keeps DVC2 stable while correcting for changing loads placed on the cell plate generator.

A test mode detection circuit 130 is included in the dynamic random access memory device along with cell plate generator 100, and has connections for activating a test mode within test mode detection circuit 130. Test mode detection circuit 130 is connected to signals from one or more external leads of the DRAM integrated circuit when it is packaged. Test mode detection circuit 130 is activated by an abnormally high voltage presented at an external pin of the DRAM. Such a voltage is sometimes referred to as a "super-voltage." It is above the range of operating voltages and supply voltages of the DRAM, and is used to initiate test modes or other special modes of operation. U.S. Pat. No. 5,118,968, hereby incorporated by reference, shows an example of a special mode activation circuit which detects a super-voltage to initiate a special mode of circuit operation. Although test mode detection circuit 130 is shown as being devoted exclusively to operation of a test mode within cell plate generator 100, it is also used to initiate other special modes of operation in other DRAM circuits upon receiving appropriate activation signals. Therefore, in addition to receiving a super-voltage or test mode activation signal, test mode detection circuit 130 is connected to receive logic or logic-level signals from various external leads of the packaged DRAM. These signals are used as control signals during testing, to initiate the various different types of tests of which the DRAM might be capable.

In response to a specified combination of these logic signals, test mode detection circuit 130 generates first and second test mode signals for use by cell plate generator 100. The first test mode signal is a reference increase signal, designated as INC in FIG. 4. The second test mode signal is a reference decrease signal, designated as DEC in FIG. 4. Test mode detection circuit 130 contains internal logic, not shown, to activate the test mode signals in response to specified stimuli.

Cell plate generator 100 includes voltage adjustment circuits which are responsive to the test mode signals to adjust the reference voltage from its nominal intermediate operating value without requiring an externally-supplied adjusted reference voltage as is commonly supplied through a test probe when testing prior art DRAMs. The voltage adjustment circuits include first and second bypass transistors 132 and 134 which are responsive to the first and second test mode signals to increase and decrease, respectively, reference voltage DVC2.

First test mode signal INC is connected to the gate of first or upper bypass transistor 132. Bypass transistor 132 is an n-channel MOSFET connected around at least one of voltage divider elements 104 of first group 102. More specifically, the source and drain of bypass transistor 132 are connected at different points or nodes along series-connected voltage divider elements 104. Even more specifically, the source and drain of bypass transistor 132 are connected to span one or more of voltage divider elements 104. When activated by first test mode signal INC, bypass transistor 132 provides a low-resistance path or short around such voltage divider elements. This lowers the effective resistance of first voltage divider element group 102, thereby pulling up or raising the voltages at intermediate voltage divider nodes 112 and 114. As a result, the effective resistance of upper driver transistor 120 is lowered while the effective resistance of lower driver transistor 122 is raised, thereby increasing the voltage at output node 124 to a first adjusted testing value which is different and greater than its nominal operating value.

Second test mode signal DEC is connected to second or lower bypass transistor 134. Lower bypass transistor 134 is an n-channel MOSFET connected around at least one of voltage divider elements 108 of second group 106. More specifically, the source and drain of bypass transistor 134 are connected at different points or nodes along series-connected voltage divider elements 108. Even more specifically, the source and drain of bypass transistor 134 are connected to span one or more of voltage divider elements 108. When activated by second test mode signal DEC, bypass transistor 134 provides a low-resistance path or short around such voltage divider elements. This lowers the effective resistance of second voltage divider element group 106, thereby decreasing the voltages at intermediate voltage divider nodes 112 and 114. As a result, the effective resistance of upper driver transistor 120 is raised while the effective resistance of lower driver transistor 122 is lowered, thereby pulling down or decreasing the voltage at output node 124 to a second adjusted testing value which is different and less than the nominal operating value. While the first and second adjusted testing values are greater and less than the nominal operating value, respectively, they remain at values between the upper and lower supply voltages. Specifically, the first adjusted testing value of DVC2 remains below $V_{cc}$, and the second adjusted testing value remains above ground.

In operation, a packaged DRAM IC is tested for acceptable DVC2 margins by presenting a supervoltage or test mode voltage, in combination with other specified logic signals, at predetermined external pins of the DRAM IC. Test mode detection circuit 130 in response switches the IC to a test mode of operation and, depending upon the specific logic signals, selectively activates either upper bypass transistor 132, through first test mode signal INC, or lower bypass transistor 134, through second test mode signal DEC. Activation of these transistors pulls the intermediate voltage divider nodes up or down, respectively. The output stage of the cell plate generator, comprising driver transistors 120 and 122, is responsive to the intermediate voltage divider nodes to similarly pull DVC2 up or down from its nominal value.

In addition to the specific arrangement described above, different combinations of bypass transistors could be used to allow for more than two DVC2 testing values. For instance, four bypass transistors could be used to bypass different numbers of voltage divider transistors.

The circuits described above allow convenient diagnostic testing of failed DRAM ICs even after packaging, without requiring probe access such as is necessary with prior art circuits. This is a significant advantage, especially in the case of LOC-packaged ICs which cannot be practically unpackaged to allow probe access. In addition, the ability to test DVC2 margins without test probe access allows DVC2 margin testing to become a practical and routine part of packaged-part production testing, thus allowing manufacturers to produce DRAMs of higher quality and reliability.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A dynamic random access memory device comprising:
   a plurality of dynamic memory cells having respective capacitors including respective capacitor cell plates;
   a cell plate voltage generator coupled to at least one of said cell plates, which produces a reference voltage at a nominal operating value, the cell plate generator including a plurality of series-connected voltage divider elements;
   means for adjusting the reference voltage from the nominal operating value without requiring an externally-supplied adjusted reference voltage, the adjusting means including bypass transistors responding to test mode signals to adjust the reference voltage from its nominal operating voltage; and
   a leads over chip (LOC) package, housing the plurality of dynamic memory cells, the cell plate voltage generator, and the adjusting means.

2. A dynamic random access memory device in accordance with claim 1 wherein the bypass transistors include a first bypass transistor connected around at least one of the series-connected voltage divider elements, to adjust the reference voltage to a first adjusted testing value by selectively bypassing at least one of the voltage divider elements.

3. A dynamic random access memory device in accordance with claim 2 and further comprising a test mode detection circuit which generates a first one of the test mode signals during testing of the dynamic random access memory, and wherein the first bypass transistor is responsive to the first test mode signal to bypass said at least one of the voltage divider elements.

4. A dynamic random access memory device in accordance with claim 2 wherein the bypass transistors include a second bypass transistor connected around at least another of the series-connected voltage divider elements, to adjust the reference voltage by selectively bypassing at least another of the voltage divider elements.

5. A dynamic random access memory device in accordance with claim 2 wherein the bypass transistors include a second bypass transistor connected around at least another of the series-connected voltage divider elements, to adjust the reference voltage to a second adjusted testing value by selectively bypassing at least another of the voltage divider elements, the first adjusted testing value being greater than the nominal operating value, and the second adjusted testing value being less than the nominal operating value.

6. A dynamic random access memory device in accordance with claim 1 wherein the series-connected voltage divider elements form at least one intermediate voltage divider node which establishes the reference voltage, the voltage divider elements being selected to normally establish the reference voltage at the nominal operating value.

7. A dynamic random access memory device in accordance with claim 1 wherein the series-connected voltage divider elements form at least one intermediate voltage divider node, and wherein the cell plate generator further comprises an output stage which is responsive to the intermediate voltage divider node to supply the reference voltage.

8. A dynamic random access memory device in accordance with claim 1 wherein the voltage divider elements comprise transistors having gates connected to the reference voltage to form a feedback loop which regulates the reference voltage.

9. A dynamic random access memory device comprising:
   a plurality of dynamic memory cells having respective capacitors including respective capacitor cell plates;
   a cell plate voltage generator coupled to at least one of said cell plates, which produces a reference voltage at a nominal operating value, the cell plate generator including a plurality of series-connected voltage divider elements;
   adjusting circuitry configured to adjust the reference voltage from the nominal operating value without requiring an externally-supplied adjusted reference voltage, the adjusting circuitry including bypass transistors responsive to test mode signals to adjust the reference voltage from its nominal operating voltage; and
   a leads over chip package, housing the plurality of dynamic memory cells, the cell plate voltage generator, and the adjusting circuitry.

10. A dynamic random access memory device in accordance with claim 9 wherein the voltage divider elements comprise transistors having gates configured to be connected to the reference voltage to form a feedback loop which regulates the reference voltage.

11. A dynamic random access memory device comprising:
    a plurality of dynamic memory cells having respective capacitors including respective capacitor cell plates;
    a cell plate voltage generator coupled to at least one of said cell plates, which produces a reference voltage at a nominal operating value, the cell plate generator including a plurality of series-connected voltage divider elements;
    adjusting circuitry configured to adjust the reference voltage from the nominal operating value without requiring an externally-supplied adjusted reference voltage, the adjusting circuitry including bypass transistors responsive to test mode signals to adjust the reference voltage from its nominal operating voltage, the bypass transistors include a first bypass transistor connected around at least one of the series-connected voltage divider elements; and
    a leads over chip package, housing the plurality of dynamic memory cells, the cell plate voltage generator, and the adjusting circuitry.

12. A dynamic random access memory device in accordance with claim 11 wherein the series-connected voltage divider elements are respectively defined by transistors.

13. A dynamic random access memory device comprising:
    a plurality of dynamic memory cells having respective capacitors including respective capacitor cell plates;
    a cell plate voltage generator coupled to at least one of said cell plates, configured to produce a reference voltage at a nominal operating value, the cell plate generator including a plurality of series-connected voltage divider elements, the series-connected voltage divider elements form at least one intermediate voltage divider node;
    adjusting circuitry configured to adjust the reference voltage from the nominal operating value without requiring an externally-supplied adjusted reference voltage, the adjusting circuitry including bypass transistors responsive to test mode signals to adjust the reference voltage from its nominal operating voltage;
    an output stage which is responsive to the intermediate voltage divider node to supply the reference voltage; and
    a leads over chip package, housing the plurality of dynamic memory cells, the cell plate voltage generator, the output stage, and the adjusting circuitry.

14. A dynamic random access memory device in accordance with claim 13 wherein the bypass transistors include a first bypass transistor connected around at least one of the series-connected voltage divider elements.

15. A dynamic random access memory device comprising:
    a plurality of dynamic memory cells having respective capacitors including respective capacitor cell plates;
    a cell plate voltage generator coupled to at least one of said cell plates, configured to produce a reference voltage at a nominal operating value, the cell plate generator including a plurality of series-connected voltage divider elements;
    bypass transistors responsive to test mode signals to adjust the reference voltage from its nominal operating voltage; and
    a leads over chip package, housing the plurality of dynamic memory cells, the cell plate voltage generator, and the bypass transistors.

* * * * *

UNITED STATES PATENT AND TRADEMARK OFFICE
CERTIFICATE OF CORRECTION

PATENT NO.    : 5,841,691

DATED         : November 24, 1998

INVENTOR(S)   : William Fink

It is certified that error appears in the above-identified patent and that said Letters Patent is hereby corrected as shown below:

Column 2, line 8, replace "connect s" with --connect--.

Column 5, line 35, replace the first instance of "4".

Signed and Sealed this

Ninth Day of March, 1999

Attest:

Q. TODD DICKINSON

Attesting Officer

Acting Commissioner of Patents and Trademarks